(12) United States Patent
Guo

(10) Patent No.: US 10,545,197 B2
(45) Date of Patent: Jan. 28, 2020

(54) SELF-CALIBRATING SYSTEM ARCHITECTURE FOR MAGNETIC DISTORTION COMPENSATION

(71) Applicant: Apple Inc., Cupertino, CA (US)

(72) Inventor: Jian Guo, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 110 days.

(21) Appl. No.: 15/711,787

(22) Filed: Sep. 21, 2017

(65) Prior Publication Data

US 2019/0086480 A1    Mar. 21, 2019

(51) Int. Cl.
*G01R 33/00* (2006.01)
*G01R 35/00* (2006.01)
*G01R 33/02* (2006.01)
*G01C 25/00* (2006.01)
*G01C 21/08* (2006.01)

(52) U.S. Cl.
CPC ......... *G01R 33/0017* (2013.01); *G01R 33/02* (2013.01); *G01R 35/005* (2013.01); *G01C 21/08* (2013.01); *G01C 25/00* (2013.01)

(58) Field of Classification Search
CPC ........ G01R 33/17; G01R 33/02; G01C 21/08; G01C 25/00
See application file for complete search history.

(56) References Cited

U.S. PATENT DOCUMENTS

| | | | | |
|---|---|---|---|---|
| 5,187,436 | A  * | 2/1993 | Mallick | G01R 33/02 |
| | | | | 324/225 |
| 6,952,095 | B1 * | 10/2005 | Goldfine | G01B 7/24 |
| | | | | 324/202 |
| 9,612,309 | B2 | 4/2017 | Jones et al. | |
| 9,720,051 | B2 | 8/2017 | Holm et al. | |
| 2003/0164700 | A1 * | 9/2003 | Goldfine | G01N 27/82 |
| | | | | 324/235 |
| 2006/0152217 | A1 * | 7/2006 | Withanawasam | G01C 17/38 |
| | | | | 324/244 |
| 2009/0273340 | A1 * | 11/2009 | Stephanson | G01R 33/10 |
| | | | | 324/202 |
| 2012/0086438 | A1 * | 4/2012 | Tu | G01R 33/0035 |
| | | | | 324/202 |
| 2012/0206129 | A1 * | 8/2012 | Mahan | G01C 17/38 |
| | | | | 324/202 |
| 2012/0210562 | A1 * | 8/2012 | Jones | G01R 33/0035 |
| | | | | 29/593 |
| 2016/0011283 | A1 * | 1/2016 | Almasi Kashi | G01R 33/14 |
| | | | | 702/79 |

(Continued)

*Primary Examiner* — Dominic E Hawkins
(74) *Attorney, Agent, or Firm* — Fish & Richardson P.C.

(57) ABSTRACT

Systems, methods, apparatuses and non-transitory computer-readable mediums are disclosed for a self-calibrating system architecture for magnetic distortion compensation. In an embodiment, an electronic system comprises: a magnetometer; a plurality of spaced-apart calibration coils proximate to the magnetometer; first circuitry configured to excite the calibration coils during a calibration phase of the electronic system; second circuitry configured to measure a first magnetic field vector in a vicinity of the magnetometer that is generated by the excited calibration coils; third circuitry configured to: generate sensitivity values based on the first magnetic field vector measurement and a baseline magnetic field vector; and a storage device configured for storing the sensitivity values.

18 Claims, 6 Drawing Sheets

(56) References Cited

U.S. PATENT DOCUMENTS

| | | | |
|---|---|---|---|
| 2016/0041233 A1* | 2/2016 | Li | G01R 33/0017 |
| | | | 324/346 |
| 2016/0041234 A1* | 2/2016 | Li | G01R 33/0035 |
| | | | 324/202 |
| 2017/0067981 A1* | 3/2017 | Hannah | G01R 35/005 |
| 2017/0146622 A1* | 5/2017 | Yang | G01R 33/3628 |
| 2018/0164348 A1* | 6/2018 | Donolo | G01R 19/2513 |

* cited by examiner

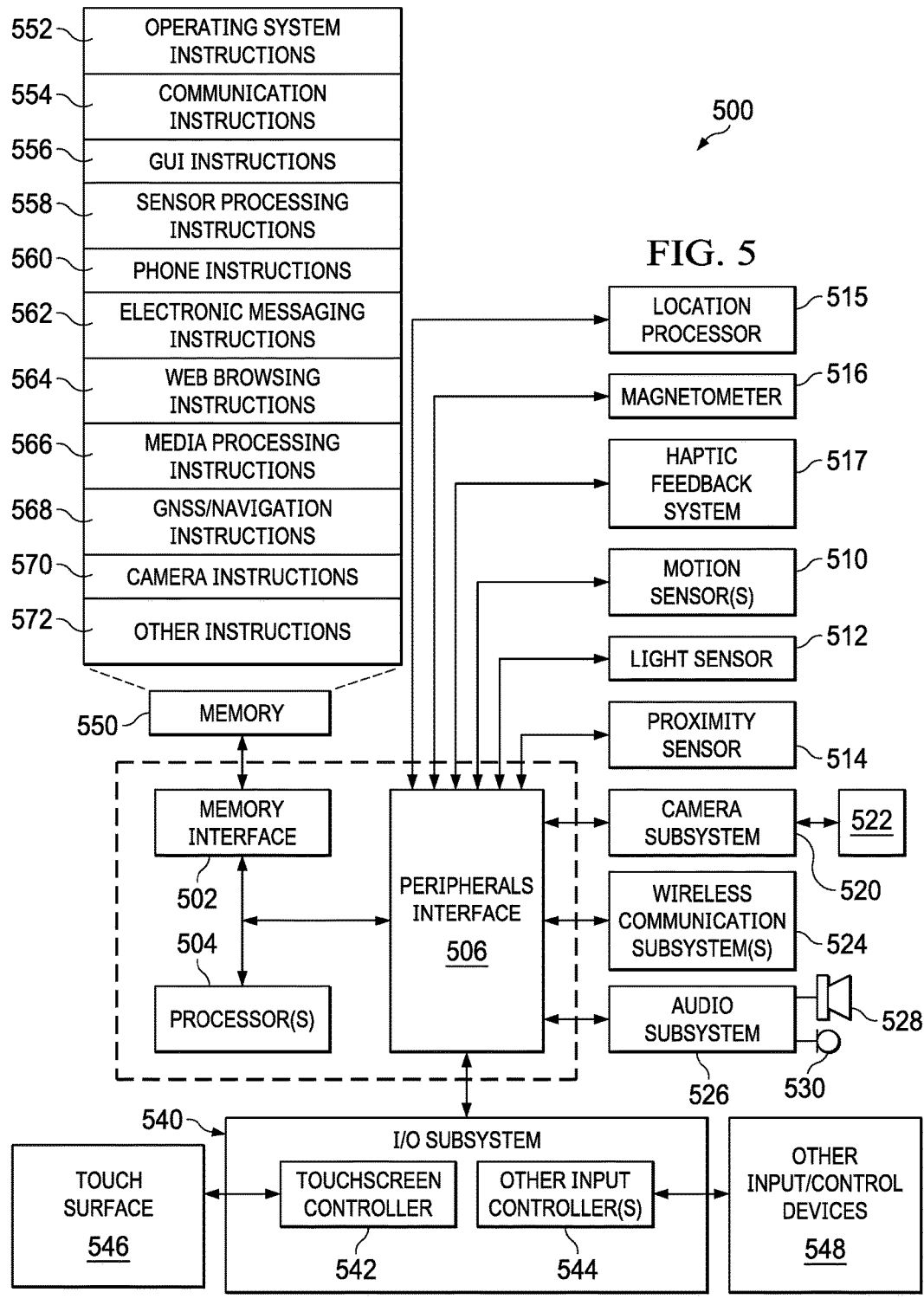

SELF-CALIBRATING SYSTEM ARCHITECTURE FOR MAGNETIC DISTORTION COMPENSATION

TECHNICAL FIELD

This disclosure relates generally to compensating for magnetic distortion in electronic systems.

BACKGROUND

Modern mobile electronic systems (e.g., smart phones, tablet computers, wearable devices, drones) utilize a digital magnetometer to provide device heading information that is critical for navigation and augmented reality (AR) related applications. The digital magnetometer obtains device heading information by sensing the direction of the local earth magnetic field, which can be easily distorted by ferromagnetic materials inside the electronic system (e.g., magnetic screws, magnetic shielding, inductors, etc.), resulting in large heading error. Traditionally, electronic systems that include a digital magnetometer need to be calibrated using an external testing fixture, which is slow, expensive and inflexible.

SUMMARY

Systems, methods, apparatuses and non-transitory, computer-readable storage mediums are disclosed for a self-calibrating system architecture for magnetic distortion compensation.

In an embodiment, an electronic system comprises: a magnetometer; a plurality of spaced-apart calibration coils proximate to the magnetometer; first circuitry configured to excite the calibration coils during a calibration phase of the electronic system; second circuitry configured to measure a first magnetic field vector in a vicinity of the magnetometer that is generated by the excited calibration coils; third circuitry configured to: generate sensitivity values based on the first magnetic field vector measurement and a baseline magnetic field vector; and a storage device configured for storing the sensitivity values.

In an embodiment, a method comprises: exciting, by first circuitry of an electronic system, a plurality of spaced-apart calibration coils proximate to a magnetometer of the electronic system; measuring, by second circuitry of the electronic system, a first magnetic field vector in a vicinity of the magnetometer that is generated by the excited calibration coils; generating, by third circuitry of the electronic system, sensitivity values based on the first magnetic field vector measurement and a baseline magnetic field vector; and storing the sensitivity values on a storage device of the electronic system.

Other embodiments include systems, methods, apparatuses and non-transitory, computer-readable mediums.

Particular embodiments disclosed herein provide one or more of the following advantages. The disclosed self-calibrating system architecture and method for magnetic distortion compensation provides a low-cost and on-demand system magnetic calibration capability for more accurate and more reliable device heading performance.

The details of the disclosed embodiments are set forth in the accompanying drawings and the description below. Other features, objects and advantages are apparent from the description, drawings and claims.

DESCRIPTION OF DRAWINGS

FIG. 5 is a block diagram of an electronic system architecture for implementing the features and processes described in reference to FIGS. 1-4, according to an embodiment.

The same reference symbol used in various drawings indicates like elements.

DETAILED DESCRIPTION

Figure 1A:
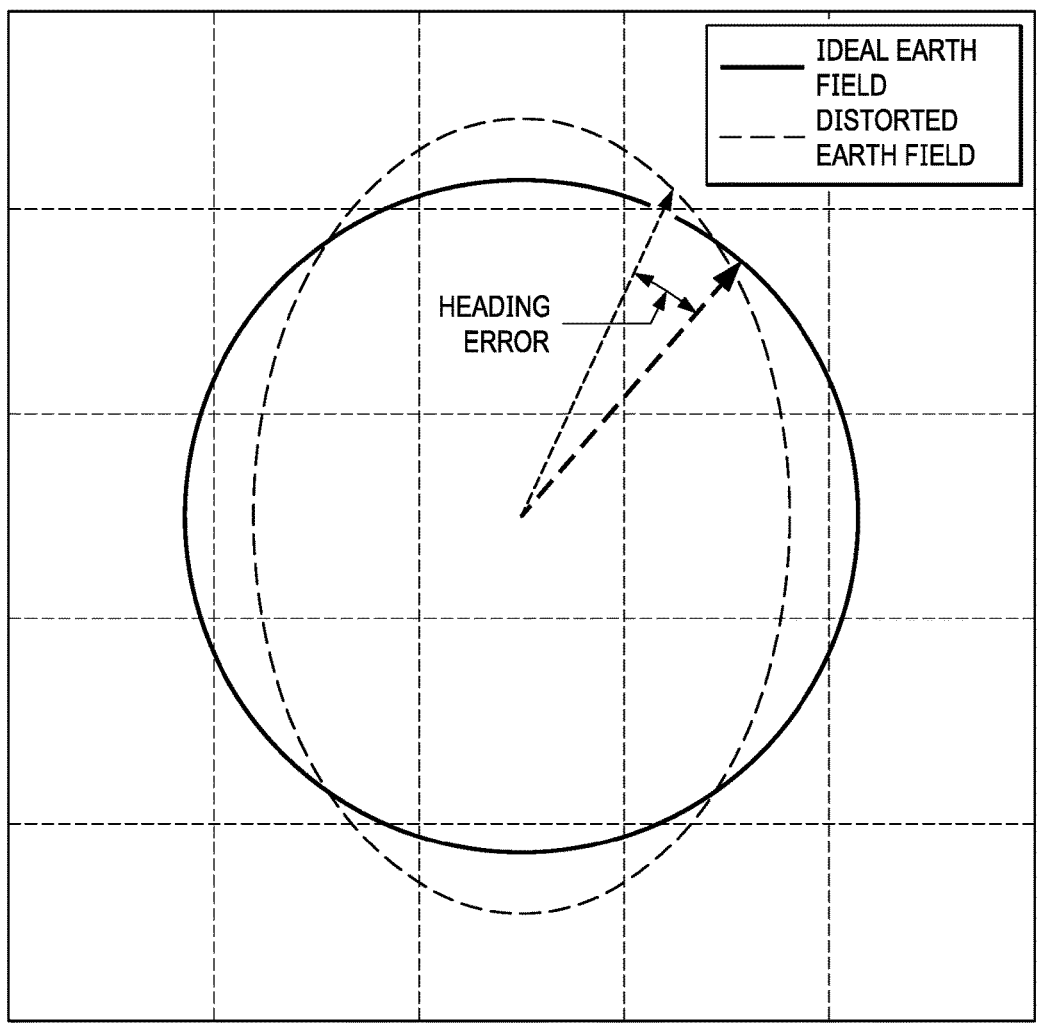
FIG. 1A illustrates magnetic field distortion.

FIG. 1A illustrates magnetic field distortion, according to an embodiment. The magnetic field distortion from a spherical magnetic sweep is shown. The device heading error is illustrated as a difference between an ideal earth magnetic field and a distorted earth magnetic field.

Figure 1B:
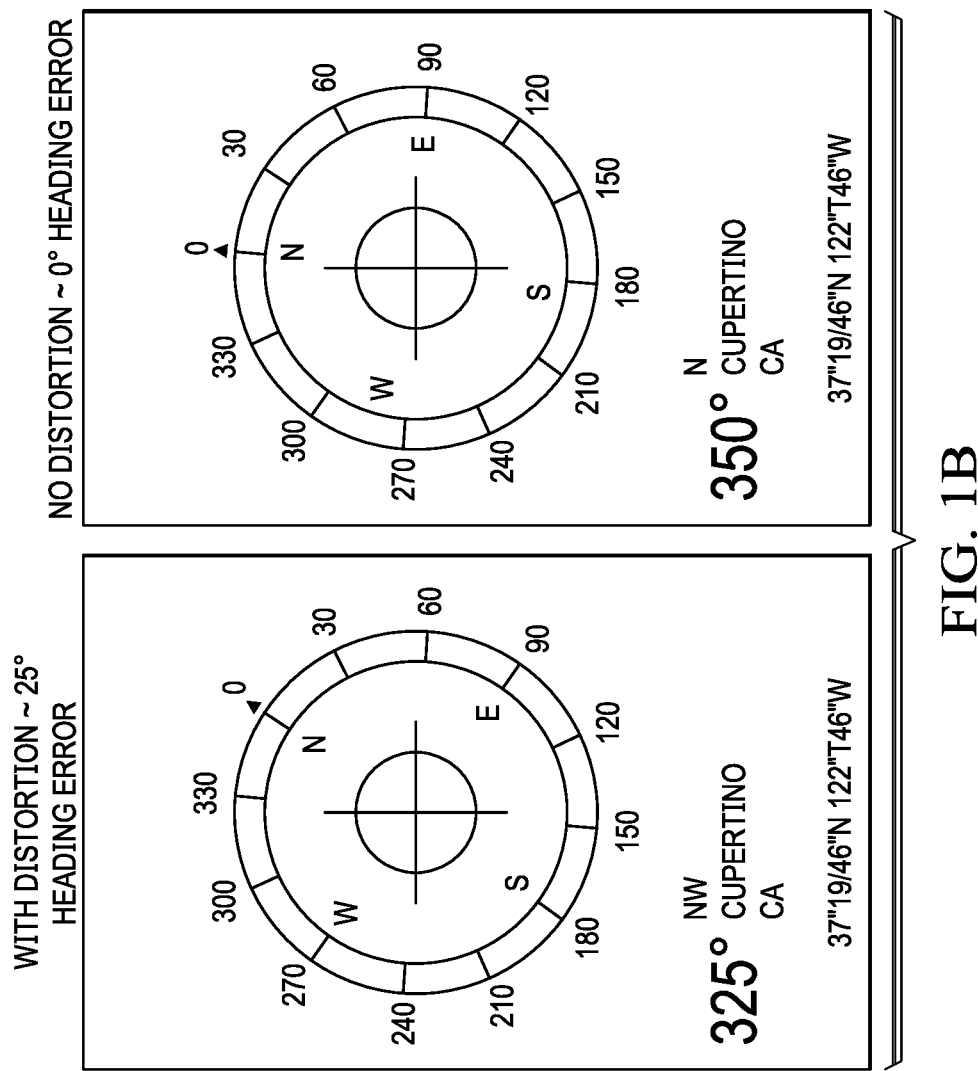
FIG. 1B illustrates device heading error due to magnetic distortion.

FIG. 1B illustrates device heading error due to magnetic distortion, according to an embodiment. A digital compass graphical user interface (GUI) for a digital compass application that runs on an electronic system (e.g., a smart phone, table computer, wearable computer, navigation device) is shown with distortion and without distortion. With magnetic distortion there can be ~25° heading error, which is not acceptable for many applications, such as navigation applications and augmented reality (AR) applications where accurate device heading information is crucial.

Example Calibration System

Figure 2A:
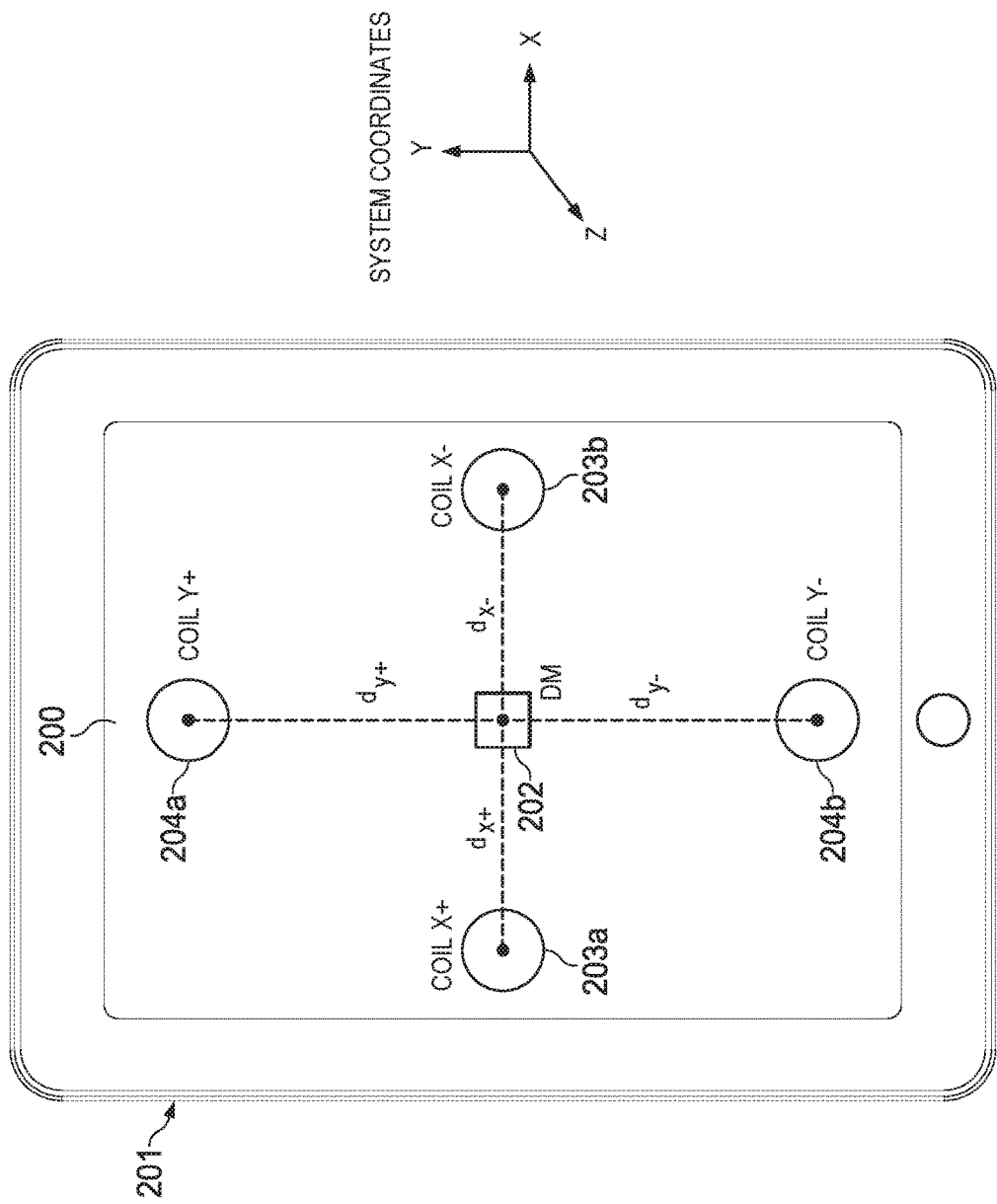
FIG. 2A illustrates a calibration system architecture, according to an embodiment.

FIG. 2A illustrates a calibration system architecture 200, according to an embodiment. For illustration purposes, digital magnetometer (DM) 202 of electronic system 201 (e.g., a smartphone, tablet computer, wearable device, navigation computer) is placed near the center of calibration system architecture 200. Calibration system architecture 200, however, can calibrate for any arbitrary system placement option. In an embodiment, calibration system architecture 200 can be implemented on a printed circuit board (PCB).

Two calibration coil pairs (203a, 203b) and (204a, 204b) generate a magnetic calibration field vector to measure the system level magnetic distortion. In an embodiment, calibration coils 203, 203b, 204a, 204b are placed near the edge of calibration system architecture 200 to ensure maximum calibration area coverage. Additionally, calibration coil pairs (203a, 203b) and (204a, 204b) are aligned with the x-axis and y-axis of DM 202, respectively, for improved calibration accuracy. The distances between calibration coils 203a, 203b, 204a, 204b and the center of DM 202 are represented by $d_{x+}$, $d_{x-}$, $d_{y+}$ and $d_{y-}$, respectively. In this example embodiment, calibration system architecture 200 is based on the right-handed coordinate system shown, where +Z is out of the page. Note, however, that any desired coordinate system can be used. In an embodiment, the calibration coils can be mounted in a two-dimensional plane of the printed circuit board. In other embodiments, the calibration coils can be mounted out-of-plane and/or on one or more printed circuit boards, include flexible printed circuit boards. In an embodiment, calibration coils can be implemented in a magnetometer integrated circuit chip or a system on chip (SoC). Power for driving the calibration coils can be taken from a power source of the electronic system (e.g., a battery).

Figure 2B:
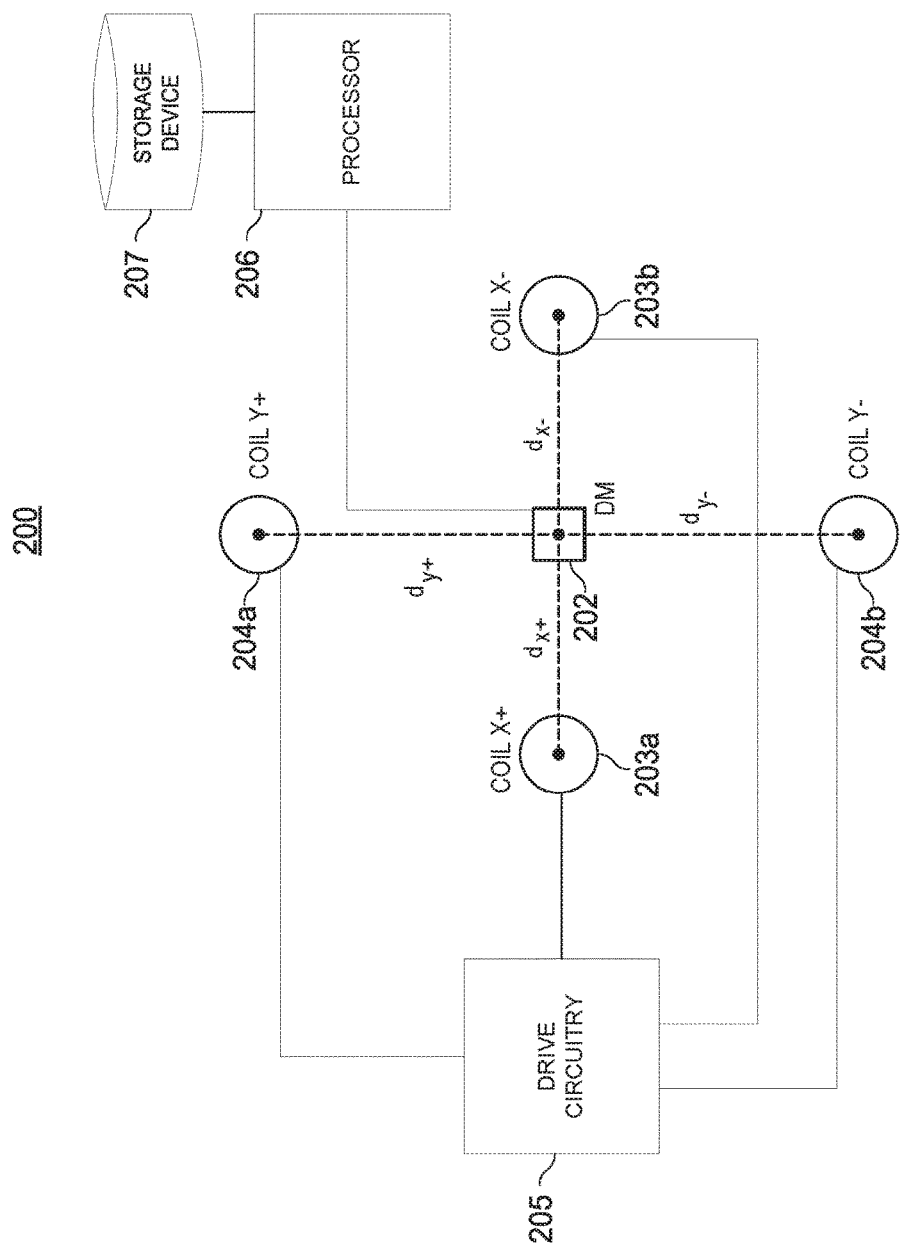
FIG. 2B further illustrates the calibration system architecture of FIG. 2, according to an embodiment.

FIG. 2B further illustrates the calibration system architecture 200 of FIG. 2A, according to an embodiment. Drive circuitry 205 (e.g., power amplifier) is configured to excite calibration coils 203a, 203b, 204a, 204b during a calibration phase. DM 202 is configured to measure a first magnetic field vector in a vicinity of DM 202 that is generated by the excited calibration coils 203a, 203b, 204a, 204b. Processor 206 is configured to generate sensitivity values based on the first magnetic field vector measurement and a baseline magnetic field vector. Storage device 207 is configured to store the sensitivity values.

Figure 3A:
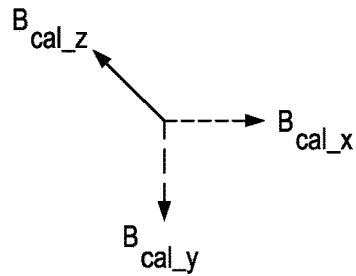
FIG. 3A illustrates vector components of an ideal calibration field without magnetic distortion, according to an embodiment.

FIG. 3A illustrates vector components of an ideal calibration magnetic field without magnetic distortion, according to an embodiment. Equations [1a] to [1c] represent the x, y, z components of the calibration field by DM 201:

$$B_{cal\_x} = B_{xx+}(d_{x+}) + B_{xx-}(d_{x-}), \qquad [1a]$$

$$B_{cal\_y} = B_{yy+}(d_{y+}) + B_{yy-}(d_{y-}), \qquad [1b]$$

$$B_{cal\_z} = B_{zx+}(d_{x+}) + B_{zx-}(d_{x-}) + B_{zy+}(d_{y+}) + B_{zy-}(d_{y-}), \qquad [1c]$$

where $\vec{B}_{cal}$ is the ideal calibration magnetic field vector having components $(B_{cal\_x}, B_{cal\_y}, B_{cal\_z})$, hereinafter also referred to as a baseline magnetic field vector. In an embodiment, a pre-defined field magnitude for the baseline magnetic field vector can be achieved by controlling at least one of the coil design (e.g., ampere-turns) or coil-to-magnetometer distance $d_n$.

Figure 3B:
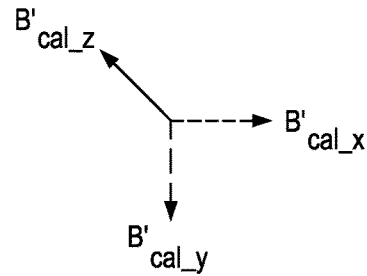
FIG. 3B illustrates vector components of an actual calibration field vector with magnetic distortion, according to an embodiment.

FIG. 3B illustrates vector components of a measured calibration magnetic field with magnetic distortion, according to an embodiment. Equations [2a]-[2c] represent x, y, z components of the measured calibration field by DM 201 that is compensated for magnetic distortion (e.g., soft iron distortion) by sensitivity values:

$$B'_{cal\_x} = B_{cal\_x} \times S_{xx} + B_{cal\_y} \times S_{xy} + B_{cal\_z} \times S_{xz}, \qquad [2a]$$

$$B'_{cal\_y} = B_{cal\_x} \times S_{xx} + B_{cal\_y} \times S_{xy} + B_{cal\_z} \times S_{yz}, \qquad [2b]$$

$$B'_{cal\_z} = B_{cal\_x} \times S_{zx} + B_{cal\_y} \times S_{zy} + B_{cal\_z} \times S_{zz}, \qquad [2c]$$

where $S_{xx}$, $S_{yy}$, $S_{zz}$ represent main-axis sensitivity at the location of DM 201 after system level magnetic distortion, and $S_{xy}$, $S_{xy}$, $S_{xz}$, $S_{zx}$, $S_{yz}$, $S_{zy}$ represent the cross-axis sensitivity at the location of DM 202 after system level magnetic distortion. Since both the ideal and the measured fields are known, the system magnetic distortion can be characterized as sensitivity distortion at the location of DM 202.

The sensitivity values can be conceptualized as a sensitivity matrix S as shown in Equation [3]:

$$S = \begin{bmatrix} S_{xx} & S_{xy} & S_{xz} \\ S_{yx} & S_{yy} & S_{yz} \\ S_{zx} & S_{zy} & S_{zz} \end{bmatrix}. \qquad [3]$$

In an embodiment, the sensitivity values are determined during a calibration phase by solving Equations [1] and [2] for the sensitivity values, which can be stored on a storage device of electronic system 201 (e.g., stored in flash memory). The sensitivity values can be used to calibrate the magnetic field measured by DM 202 during a non-calibration phase, as shown in Equation [4]:

$$\begin{bmatrix} B_{comp\_x} \\ B_{comp\_y} \\ B_{comp\_z} \end{bmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix} \begin{bmatrix} B_{meas\_x} \\ B_{meas\_y} \\ B_{meas\_z} \end{bmatrix}, \qquad [4]$$

where $\vec{B}_{meas}$ is the magnetic field vector measured by DM 202 during a non-calibration phase, S is the sensitivity matrix and $\vec{B}_{comp}$ is the compensated magnetic field vector. The compensated magnetic field vector $\vec{B}_{comp}$ can then be used by one or more applications to determine a more accurate device heading.

Example Calibration Process

Figure 4:
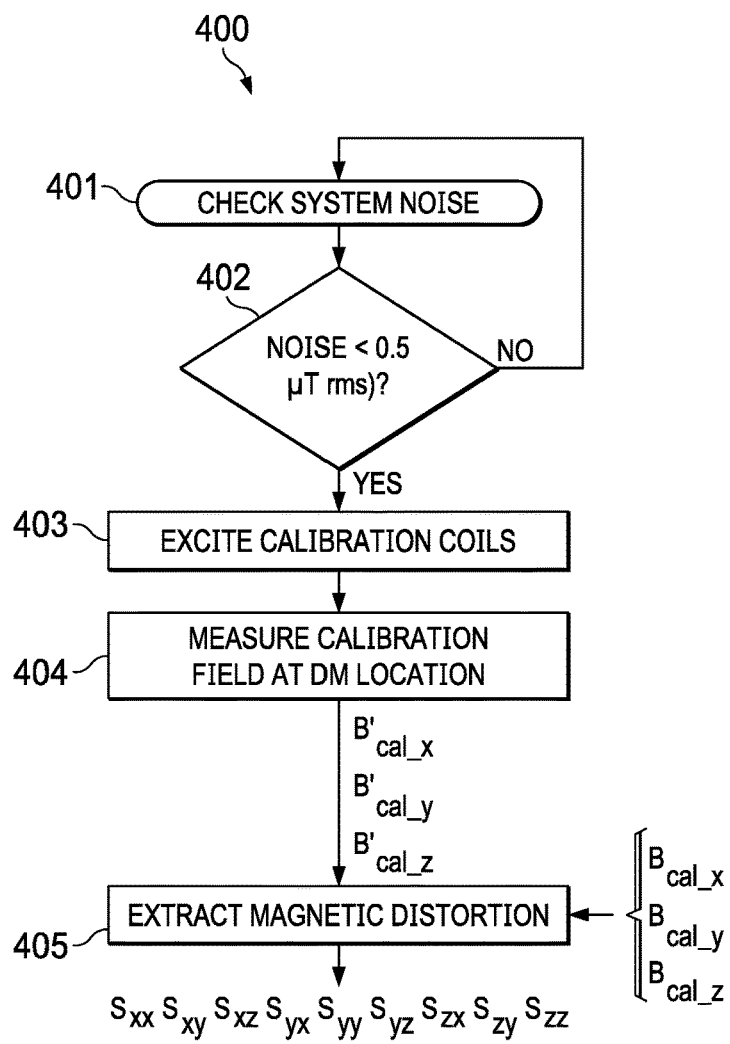
FIG. 4 is a flow diagram of a self-calibration process for compensating magnetic distortion, according to an embodiment.

FIG. 4 is a flow diagram of self-calibration process 400, according to an embodiment. Process 400 can be implemented using, for example, electronic system architecture 500, as described in reference to FIG. 5.

Process 400 can begin by checking system noise to ensure that self-calibration is performed in a magnetically benign environment (401). For example, the DM can be used to measure system noise. If 402, the system noise is less than a threshold (e.g., noise<0.5 µT), then the calibration coils can be excited to generate a calibration magnetic field (403). In an embodiment, the calibration coils are excited by input current generated by, for example, drive circuitry (e.g., a power amplifier). Process 400 can continue by measuring the calibration field at the DM location using the DM (404). Process 400 can continue by determining sensitivity values (405) using Equations [1] and [2].

Example Device Architecture

FIG. 5 is a block diagram of an electronic system architecture 500 for implementing the features and processes described in reference to FIGS. 1-4, according to an embodiment. Architecture 500 may include memory interface 502, data processor(s), image processor(s) or central processing unit(s) 504, and peripherals interface 506. Memory interface 502, processor(s) 504 or peripherals interface 506 may be separate components or may be integrated in one or more integrated circuits. One or more communication buses or signal lines may couple the various components.

Sensors, devices, and subsystems may be coupled to peripherals interface 506 to facilitate multiple functionalities. For example, motion sensor(s) 510, light sensor 512, and proximity sensor 514 may be coupled to peripherals interface 506 to facilitate orientation, lighting, and proximity functions of the device. For example, in some embodiments, light sensor 512 may be utilized to facilitate adjusting the brightness of touch surface 546. In some embodiments, motion sensor(s) 510 (e.g., an accelerometer, rate gyroscope) may be utilized to detect movement and orientation of the device. Accordingly, display objects or media may be presented according to a detected orientation (e.g., portrait or landscape). Haptic feedback system 517, under the control of haptic feedback instructions 572, provides haptic feedback in the form of vibration.

Other sensors may also be connected to peripherals interface 506, such as a temperature sensor, a barometer, a biometric sensor, or other sensing device, to facilitate related functionalities. For example, a biometric sensor can detect fingerprints and monitor heart rate and other fitness parameters.

Location processor 515 (e.g., GNSS receiver chip) may be connected to peripherals interface 506 to provide geo-referencing. Electronic magnetometer 516 (e.g., an integrated circuit chip) may also be connected to peripherals interface 506 to provide data that may be used to determine the direction of magnetic North. Thus, electronic magnetometer 516 may be used as an electronic compass. Electronic magnetometer can be a multi-axis magnetometer.

Camera subsystem 520 and an optical sensor 522, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 524. Communication subsystem(s) 524 may include one or more wireless communication subsystems. Wireless communication subsystems 524 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and embodiment of the communication subsystem 524 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 524 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 526 may be coupled to a speaker 528 and one or more microphones 530 to facilitate voice-enabled functions, such as voice recognition, voice replication, digital recording, and telephony functions.

I/O subsystem 540 may include touch controller 542 and/or other input controller(s) 544. Touch controller 542 may be coupled to a touch surface 546. Touch surface 546 and touch controller 542 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 546. In one embodiment, touch surface 546 may display virtual or soft buttons and a virtual keyboard, which may be used as an input/output device by the user.

Other input controller(s) 544 may be coupled to other input/control devices 548, such as one or more buttons, rocker switches, thumb-wheel, infrared port, USB port, and/or a pointer device such as a stylus. The one or more buttons (not shown) may include an up/down button for volume control of speaker 528 and/or microphone 530.

In some embodiments, device 500 may present recorded audio and/or video files, such as MP3, AAC, and MPEG video files. In some embodiments, device 500 may include the functionality of an MP3 player and may include a pin connector for tethering to other devices. Other input/output and control devices may be used.

Memory interface 502 may be coupled to memory 550. Memory 550 may include high-speed random access memory or non-volatile memory, such as one or more magnetic disk storage devices, one or more optical storage devices, or flash memory (e.g., NAND, NOR). Memory 550 may store operating system 552, such as Darwin, RTXC, LINUX, UNIX, OS X, iOS, WINDOWS, or an embedded operating system such as VxWorks. Operating system 552 may include instructions for handling basic system services and for performing hardware dependent tasks. In some embodiments, operating system 552 may include a kernel (e.g., UNIX kernel).

Memory 550 may also store communication instructions 554 to facilitate communicating with one or more additional devices, one or more computers or servers, including peer-to-peer communications. Communication instructions 554 may also be used to select an operational mode or communication medium for use by the device, based on a geographic location (obtained by the GPS/Navigation instructions 568) of the device.

Memory 550 may include graphical user interface instructions 556 to facilitate graphic user interface processing, including a touch model for interpreting touch inputs and gestures; sensor processing instructions 558 to facilitate sensor-related processing and functions; phone instructions 560 to facilitate phone-related processes and functions; electronic messaging instructions 562 to facilitate electronic-messaging related processes and functions; web browsing instructions 564 to facilitate web browsing-related processes and functions; media processing instructions 566 to facilitate media processing-related processes and functions; GNSS/Navigation instructions 568 to facilitate GNSS (e.g., GPS, GLOSSNAS) and navigation-related processes and functions; camera instructions 570 to facilitate camera-related processes and functions; and other instructions 572 for implementing one or more applications including, for example, a virtual reality application, gaming application, navigation application or an electronic compass application.

Each of the above identified instructions and applications may correspond to a set of instructions for performing one or more functions described above. These instructions need not be implemented as separate software programs, procedures, or modules. Memory 550 may include additional instructions or fewer instructions. Furthermore, various functions of the device may be implemented in hardware and/or in software, including in one or more signal processing and/or application specific integrated circuits (ASICs).

In an embodiment, architecture 500 can be implemented at least in part on one or more printed circuit boards that include a plurality of calibration coils, as described in reference to FIGS. 1-4. Note that the calibration coils can be coupled to drive circuitry (not shown) that generates input current to excite the coils. The drive circuitry can be coupled to the one or more processors 504 to receive commands to turn the current to the calibration coils on and off in response to one or more trigger events, such as a start and stop even of a magnetometer calibration phase.

A number of embodiments have been described. Nevertheless, it will be understood that various modifications may be made. Elements of one or more embodiments may be combined, deleted, modified, or supplemented to form further embodiments. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. An electronic system comprising:
   a magnetometer;
   a plurality of spaced-apart calibration coils proximate to the magnetometer;
   first circuitry configured to excite the calibration coils;
   second circuitry in the magnetometer configured to measure a first magnetic field vector in a vicinity of the magnetometer that is generated by the excited calibration coils during a calibration phase, and measure a second magnetic field vector in the vicinity of the magnetometer during a non-calibration phase;
   third circuitry configured to:
      generate sensitivity values during the calibration phase based on the first magnetic field vector measurement and a baseline magnetic field vector; and
      compensate the second magnetic field vector during the non-calibration phase using the sensitivity values to generate a compensated magnetic field vector.

2. The electronic system of claim 1, wherein the third circuitry is further configured to:
   calculate a heading of the electronic system using the compensated magnetic field vector; and
   provide the heading to one or more applications running on the electronic system.

3. The electronic system of claim 1, wherein the third circuitry is one or more microprocessors or microprocessor cores.

4. The electronic system of claim 1, wherein the magnetometer and the calibration coils are placed on a printed circuit board, and a first pair of calibration coils are aligned with a first axis of the magnetometer in a first plane- and a second pair of calibration coils are aligned with a second axis of the magnetometer in a second plane that is orthogonal to the first axis.

5. The electronic system of claim 4, wherein the calibration coils are configured to minimize cross-axis magnetic fringe fields.

6. The electronic system of claim 4, wherein the calibration coils are placed near edges of the printed circuit board to maximize coverage area for calibration.

7. The electronic system of claim 4, wherein the first pair of calibration coils are placed equidistance from the magnetometer, and the second pair of calibration coils are placed equidistance from the magnetometer.

8. The electronic system of claim 1, wherein the baseline magnetic field vector has a magnitude that is determined by at least one of coil design or a distance between the calibration coils and the magnetometer.

9. The electronic system of claim 1, wherein the third circuitry is further configured to: determine a level of system magnetic noise; and
   initiate the calibration phase if the system magnetic noise is less than a threshold system magnetic noise.

10. A method comprising:
    exciting, by first circuitry of an electronic system, a plurality of spaced-apart calibration coils proximate to a magnetometer of the electronic system;
    measuring, by second circuitry of the magnetometer, a first magnetic field vector in a vicinity of the magnetometer that is generated by the excited calibration coils;
    generating, by third circuitry of the electronic system, sensitivity values based on the first magnetic field vector measurement and a baseline magnetic field vector;
    determining, by the third circuitry, that the electronic system is in a non-calibration phase;
    measuring, by the second circuitry, a second magnetic field vector in the vicinity of the magnetometer that is generated when the calibration coils are not excited; and
    compensating, by the third circuitry, the second magnetic field vector using the sensitivity values to generate a compensated magnetic field vector.

11. The method of claim 10, further comprising:
    calculating, by one or more processors, a heading of the electronic system using the compensated magnetic field vector; and
    providing, by the one or more processors, the heading to one or more applications running on the electronic system.

12. The method of claim 10, wherein the magnetometer and the calibration coils are placed on a printed circuit board, and a first pair of calibration coils are aligned with a first axis of the magnetometer in a first plane and a second pair of calibration coils are aligned with a second axis of the magnetometer in a second plane that is orthogonal to the first axis.

13. The method of claim 12, wherein the calibration coils are configured to minimize cross-axis magnetic fringe fields.

14. The method of claim 12, wherein the calibration coils are placed near edges of the printed circuit board to maximize coverage area for calibration.

15. The method of claim 12, wherein the first pair of calibration coils are placed equidistance from the magnetometer, and the second pair of calibration coils are placed equidistance from the magnetometer.

16. The method of claim 10, wherein the baseline magnetic field vector has a magnitude that is determined by at least one of coil design or a distance between the calibration coils and the magnetometer.

17. The method of claim 10, further comprising:
    determining, by one or more processors, a level of system magnetic noise; and
    initiating, by the one or more processors, a calibration phase if the system magnetic noise is less than a threshold system magnetic noise.

18. An electronic system comprising:
    means for exciting a plurality of spaced-apart calibration coils proximate to a magnetometer of the electronic system;

means for measuring a first magnetic field vector in a vicinity of the magnetometer that is generated by the excited calibration coils;

means for generating sensitivity values based on the first magnetic field vector measurement and a baseline magnetic field vector;

means for determining that the electronic system is in a non-calibration phase;

means for measuring a second magnetic field vector in the vicinity of the magnetometer that is generated when the calibration coils are not excited; and means for compensating the second magnetic field vector using the sensitivity values to generate a compensated magnetic field vector.

* * * * *

UNITED STATES PATENT AND TRADEMARK OFFICE
CERTIFICATE OF CORRECTION

PATENT NO. : 10,545,197 B2
APPLICATION NO. : 15/711787
DATED : January 28, 2020
INVENTOR(S) : Jian Guo Page 1 of 1

It is certified that error appears in the above-identified patent and that said Letters Patent is hereby corrected as shown below:

In the Claims

Column 7, Line 52, In Claim 4, delete "plane-" and insert -- plane --.

Signed and Sealed this
Thirty-first Day of March, 2020

Andrei Iancu
*Director of the United States Patent and Trademark Office*